United States Patent
Hennerkes et al.

(10) Patent No.: US 9,507,269 B2
(45) Date of Patent: Nov. 29, 2016

(54) ILLUMINATION OPTICAL UNIT FOR PROJECTION LITHOGRAPHY

(71) Applicant: Carl Zeiss SMT GmbH, Oberkochen (DE)

(72) Inventors: Christoph Hennerkes, Huettingen (DE); Ingo Saenger, Heidenheim (DE); Joerg Zimmermann, Aalen (DE); Johannes Ruoff, Aalen (DE); Martin Meier, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 406 days.

(21) Appl. No.: 14/135,540

(22) Filed: Dec. 19, 2013

(65) Prior Publication Data

US 2014/0111785 A1    Apr. 24, 2014

Related U.S. Application Data

(63) Continuation of application No. PCT/EP2012/063520, filed on Jul. 11, 2012.

(60) Provisional application No. 61/506,250, filed on Jul. 11, 2011.

(30) Foreign Application Priority Data

Jul. 11, 2011    (DE) .......................... 10 2011 078 928

(51) Int. Cl.
*G03B 27/54* (2006.01)
*G03F 7/20* (2006.01)
(Continued)

(52) U.S. Cl.
CPC ......... *G03F 7/70191* (2013.01); *G02B 7/1815* (2013.01); *G02B 17/06* (2013.01);
(Continued)

(58) Field of Classification Search
CPC   G02B 17/06; G02B 26/0816; G02B 7/1815; G03F 7/70108; G03F 7/70116; G03F 7/70191; G03F 7/70891

USPC .......................................................... 355/67
See application file for complete search history.

(56) References Cited

U.S. PATENT DOCUMENTS 5,382,999 A    1/1995    Kamon
5,452,054 A    9/1995    Dewa et al.
(Continued)

FOREIGN PATENT DOCUMENTS

DE    10 2008 021 833 B4    7/2009
DE    10 2009 029 103          5/2010
(Continued)

OTHER PUBLICATIONS

International Search Report for corresponding PCT Appl No. PCT/EP2012/063520, dated Oct. 19, 2012.
(Continued)

*Primary Examiner* — Peter B Kim
(74) *Attorney, Agent, or Firm* — Fish & Richardson P.C.

(57) ABSTRACT

An illumination optical unit for projection lithography has a first polarization mirror device to reflect and polarize of illumination light. A second mirror device, which is disposed downstream of the polarization mirror device reflects an illumination light beam. At least one drive device is operatively connected to at least one of the two mirror devices. The two mirror devices are displaceable relative to one another via the drive device between a first relative position, which leads to a first beam geometry of the illumination light beam after reflection at the second mirror device, and a second relative position, which leads to a second beam geometry of the illumination light beam after reflection at the second mirror device, which is different from the first beam geometry. This results in a flexible predefinition of different illumination geometries, in particular of different illumination geometries with rotationally symmetrical illumination.

22 Claims, 5 Drawing Sheets (51) Int. Cl.
*G02B 7/18* (2006.01)
*G02B 17/06* (2006.01)
*G02B 26/08* (2006.01)

(52) U.S. Cl.
CPC ....... *G02B26/0816* (2013.01); *G03F 7/70108* (2013.01); *G03F 7/70116* (2013.01); *G03F 7/70891* (2013.01)

(56) References Cited

U.S. PATENT DOCUMENTS

| | | | |
|---|---|---|---|
| 5,504,627 | A | 4/1996 | Kim et al. |
| 6,573,978 | B1 | 6/2003 | McGuire |
| 7,414,781 | B2 | 8/2008 | Mann et al. |
| 2007/0091485 | A1 | 4/2007 | Phillips et al. |
| 2007/0132977 | A1 | 6/2007 | Komatsuda |
| 2008/0192225 | A1 | 8/2008 | Mann et al. |
| 2009/0213356 | A1 | 8/2009 | Gruner et al. |
| 2011/0001947 | A1* | 1/2011 | Dinger ............ G02B 26/06 355/67 |

FOREIGN PATENT DOCUMENTS

| | | |
|---|---|---|
| EP | 1 811 547 A1 | 7/2007 |
| JP | H06-181153 | 6/1994 |
| JP | H06-267891 | 9/1994 |
| JP | 2005-303084 | 10/2005 |
| JP | 2007-536754 | 12/2007 |
| JP | 2008-538452 | 10/2008 |
| JP | 2011-512659 | 4/2011 |
| WO | WO 2005/109104 | 11/2005 |
| WO | WO 2006/082739 | 8/2006 |
| WO | WO 2006/111319 A2 | 10/2006 |
| WO | WO 2009/100856 | 8/2009 |
| WO | WO 2013/135532 | 9/2013 |
| WO | WO 2013/178432 | 12/2013 |

OTHER PUBLICATIONS

German translation, with translation thereof, for corresponding DE Appl No. 10 2011 078 928.6, dated Feb. 17, 2012.
Japanese office action, with English translation thereof, for corresponding JP Appl No. 2014-519525, dated Apr. 15, 2016.

* cited by examiner

ILLUMINATION OPTICAL UNIT FOR PROJECTION LITHOGRAPHY

The contents of German patent application DE 10 2011 078 928.6 are incorporated by reference.

The invention relates to an illumination optical unit for projection lithography. Furthermore, the invention relates to an optical system comprising an illumination optical unit of this type and a projection optical unit, and to a projection exposure apparatus comprising an optical system of this type and an EUV light source.

An illumination optical unit of the type mentioned in the introduction is known from U.S. Pat. No. 7,414,781, from U.S. 2008/0192225 A1, and from DE 10 2008 021 833 B4. Further projection exposure apparatuses and components therefore are known from U.S. 2007/0132977 A1, U.S. Pat. No. 5,452,054 A and U.S. Pat. No. 5,504,627 A.

It is an objective of the present invention to develop an illumination optical unit of the type mentioned in the introduction in such a way that a flexible predefinition of different illumination geometries, in particular of different illumination geometries with rotationally symmetrical illumination, is possible.

This objective is achieved according to the invention via an illumination optical unit comprising for projection lithography, which includes: a first polarization mirror device for the reflection and polarization of illumination light; at least one second mirror device disposed downstream of the polarization mirror device in the beam path of the illumination light for the reflection of an illumination light beam; and at least one drive device which is operatively connected to at least one of the two mirror devices. The two mirror devices are displaceable relative to one another with the aid of the drive device between: a first relative position, which leads to a first beam geometry of the illumination light beam after reflection at the second mirror device; and a second relative position, which leads to a second beam geometry of the illumination light beam after reflection at the second mirror device which is different from the first beam geometry.

The illumination optical unit according to the invention makes possible, depending on the relative position of the two mirror devices with respect to one another, a variable predefinition of a geometry in particular of a cross section of the illumination light beam, and thus a variable illumination geometry. In particular, it is possible, via the displacement of the two mirror elements with respect to one another, to set a ring beam, that is to say an illumination light beam having a ring-shaped cross section, with a variably predefinable ring radius. The function of the illumination optical unit according to the invention can correspond to that of a zoom axicon, as is known, for example, from DE 10 2009 029 103 A1.

A polarization mirror device comprising a conical mirror basic body is advantageous, in particular, for setting a ring beam having a variable diameter. The mirror basic body can have a reflective cone lateral surface. The mirror basic body can have a reflective lateral surface which is embodied in curved fashion also in the axial longitudinal section of the cone and which then brings about additional beam shaping. The curvature can be embodied in convex fashion or in concave fashion or else in mixed convex/concave fashion. The mirror basic body can be embodied in solid fashion, which improves heat dissipation from a reflective surface of the polarization mirror device into the mirror basic body, such that external active cooling can be dispensable.

An active cooling device for the mirror body enables effective cooling particularly when the mirror basic body is heated on account of residual absorption of the illumination light. A liquid or a gas, for example nitrogen, can be used as cooling medium of the cooling device. The active cooling device can also be used for mirror basic bodies which are not configured in conical fashion.

In some embodiments, the unit includes a coolant line with at least one spoke line which has a radial course component with respect to a rotational symmetry axis of the mirror basic body, and/or a coolant feed line via at least one axial line which runs along a rotational symmetry axis of the mirror basic body. Such embodiments have proved to be particularly suitable in conjunction with a rotationally symmetrical mirror basic body.

A ring-shaped outer mirror basic body of the second mirror device makes it possible to guide an illumination light ring beam. The ring-shaped outer mirror basic body can have a conically extending inner ring mirror surface. The ring-shaped outer mirror basic body can be subdivided into a plurality of ring mirror surfaces which can be displaceable relative to one another in driven fashion. The ring mirror surface can be segmented.

An embodiment of the polarization mirror device comprising the inner mirror basic body in the form of a cone support frame having a conical base shape, and a plurality of mirror facets mounted on the cone supporting frame_makes it possible to split the incident illumination light into illumination light partial beams, which can then illuminate an object to be illuminated from different directions.

In some embodiments, at least some of the mirror facets (are tiltable about at least one tilting axis via assigned facet actuators. Such an embodiment ensures an additional degree of freedom for producing a variable illumination. As a result of the tiltability of the facets, besides ring beams that are predefinable in terms of their radius it is also possible to produce redistributions in an azimuthal direction, as a result of which, for example, multipole illuminations can be realized. The tiltable mirror facets can be embodied as switchable between two tilting positions.

In some embodiments, the tilting axis lies in a plane containing the rotational symmetry axis of the cone supporting frame and runs parallel to a cone lateral surface of the basic shape of the cone supporting frame, and/or the tilting axis runs tangentially with respect to the rotational symmetry axis of the cone supporting frame and parallel to a cone base surface of the basic shape of the cone supporting frame. Such embodiments it possible also to use polarizing properties during the reflection at the mirror facets for the predefinition of an illumination geometry. Instead of such parallel courses, small angles relative to the reference planes respectively specified are also permissible.

In some embodiments in which the second mirror device has the ring-shaped outer mirror basic body in the form of at least one ring supporting frame, and a plurality of mirror facets mounted on the ring supporting frame. Such embodiments can likewise be used for guiding illumination light partial beams. In cooperation with a polarization mirror device likewise having mirror facets, an illumination light guidance can be realized in which partial beams are respectively reflected from a mirror facet of the polarization mirror device and in the process polarized, if appropriate, and are subsequently reflected from one of the mirror facets of the second mirror device.

The outer mirror basic body can have at least two ring supporting frames which are displaceable relative to one another along a ring rotational symmetry axis axially with the drive device. This can_once again increase a variability in the predefinition of an illumination geometry.

The objective mentioned in the introduction is additionally achieved via an illumination optical unit in which the outer mirror basic body has at least two ring supporting frames which are displaceable relative to one another along a ring rotational symmetry axis axially with the drive device.

An illumination optical unit for projection lithography includes a polarization mirror device for the reflection and polarization of illumination light, which has: a supporting frame having a conical basic shape, and a plurality of mirror facets mounted on the supporting frame. Such a unit need not necessarily have two mirror devices displaceable relative to one another in driven fashion. The polarization mirror device can be used, in particular, for converting the incident illumination light into a plurality of partial beams. Such a polarization mirror device can constitute the first polarization mirror device of an illumination optical unit that includes: a first polarization mirror device for the reflection and polarization of illumination light; at least one second mirror device disposed downstream of the polarization mirror device in the beam path of the illumination light for the reflection of an illumination light beam; and at least one drive device which is operatively connected to at least one of the two mirror devices. The two mirror devices are displaceable relative to one another with the aid of the drive device between: a first relative position, which leads to a first beam geometry of the illumination light beam after reflection at the second mirror device; and a second relative position, which leads to a second beam geometry of the illumination light beam after reflection at the second mirror device which is different from the first beam geometry. The polarization mirror device can comprise the development explained above. The polarization mirror device comprising the mirror facets and/or the second mirror device comprising the mirror facets can be used instead of a field facet mirror and/or instead of a pupil facet mirror of an illumination optical unit according to U.S. Pat. No. 7,414,781. The mirror facets can be embodied as switchable between two tilting positions.

The different variants of an illumination optical unit as discussed above can be used for producing an illumination setting, as explained below. In this case, the illumination setting of an illumination optical unit constitutes an illumination light intensity distribution—set via the illumination optical unit—in pupil plane of the illumination optical unit. Depending on this set illumination light intensity distribution, this results in a corresponding distribution of the illumination angles for the field points of the object field. Examples of such illumination settings are given in DE 10 2008 021 833 B4.

When the illumination setting is produced with the aid of one of the variants of the illumination optical unit discussed above, a relative positioning of the two mirror devices, which are displaceable relative to one another with the aid of the drive device, can be effected in such a way as to result in an annular illumination setting, that is to say a ring-shaped intensity distribution of the illumination light in the pupil plane of the illumination optical unit. Depending on the relative positioning of the two mirror devices with respect to one another, it is possible to predefine a radius of the ring-shaped illumination light intensity distribution in the pupil plane of the illumination optical unit in an adjustable manner. This results in a correspondingly adjustable predefinition of the respective minimum and maximum illumination angles for the field points of the object field.

Alternatively or additionally, the two mirror devices can be positioned relative to one another such that a tangentially polarized illumination setting results. In the case of a tangentially polarized illumination setting, the illumination light, independently of the illumination angle, is always polarized perpendicularly to a plane of incidence of the illumination light on the object field. In the case of a simultaneously tangentially polarized and annular illumination setting, the illumination light intensity distribution in the pupil plane of the illumination optical unit is embodied in a ring-shaped fashion with a linear polarization which runs in each case tangentially with respect to a center of the ring of the illumination light intensity distribution.

Alternatively or additionally, the two mirror devices can be positioned relative to one another such that a multipole setting results, that is to say an illumination setting with an illumination of the object field points from at least two pole directions. Examples of a multipole illumination setting are a dipole or a quadrupole setting. Such a multipole illumination setting can be produced, in particular, via an embodiment of the illumination optical unit in which at least some of the mirror facets are tiltable about at least one tilting axis via assigned facet actuators. An illumination optical unit in which the second mirror device comprises a second mirror device having a ring-shaped outer mirror basic body in the form of at least one ring supporting frame on which a plurality of mirror facets tiltable about at least one tilting axis are mounted constitutes one variant for producing such a multipole setting.

The relative positioning of the two mirror devices can be such, during the production of the illumination setting that the poles of a multipole setting have a uniform linear polarization. Within one of the poles of the multipole setting, therefore, there is then for example a linear polarization of the illumination light in one and the same direction.

The advantages of an optical system including an illumination optical unit described above for illuminating an object field and a projection optical unit for imaging the object field into an image field_correspond to those which have already been explained above in connection with the illumination optical units according to the invention. The optical system can be part of an illumination system to which an EUV light source additionally belongs as well. The EUV light source can have a wavelength in the range of between 5 nm and 30 nm as used wavelength. The reflective mirror surfaces of the illumination optical unit can bear reflection coatings, which can be embodied as multilayer coatings.

The advantages of a projection exposure apparatus an illumination system comprising such an optical system and an EUV light source and also comprising an object holder for mounting an object which can be arranged in the object field, and comprising a substrate holder for mounting a substrate which can be arranged in the image field correspond to those which have already been explained above with reference to the illumination system. The projection exposure apparatus can be used for producing a patterned component, more particularly a semiconductor component, for example a micro- or nanostructured chip. Firstly a reticle and a wafer are provided and then a structure on the reticle is projected onto a light-sensitive layer of the wafer with the aid of the projection exposure apparatus, wherein, by developing the light-sensitive layer, a micro- or nanostructure is finally produced on the wafer. A micro- or nanostructured component can be produced by this method.

Exemplary embodiments of the invention are explained in greater detail below with reference to the drawing, in which.

A projection exposure apparatus 1 for microlithography has a light source 2 for illumination light or illumination radiation 3. The light source 2 is an EUV light source that generates light in a wavelength range of, for example, between 5 nm and 30 nm, in particular between 5 nm and 10 nm. The light source 2 can be, in particular, a light source having a wavelength of 13.5 nm or a light source having a wavelength of 6.9 nm. Other EUV wavelengths are also possible. In general, even arbitrary wavelengths, for example visible wavelengths or else other wavelengths which can be used in microlithography and are available for the suitable laser light sources and/or LED light sources (for example 365 nm, 248 nm, 193 nm, 157 nm, 129 nm, 109 nm), are possible for the illumination light 3 guided in the projection exposure apparatus 1. A beam path of the illumination light 3 is illustrated extremely schematically in FIG. 1.

An illumination optical unit 6 serves for guiding the illumination light 3 from the light source 2 toward an object field 4 in an object plane 5. Via a projection optical unit or imaging optical unit 7, the object field 4 is imaged into an image field 8 in an image plane 9 with a predefined reduction scale. One of the exemplary embodiments illustrated in FIG. 2 et seq. can be used for the illumination optical unit 6. The projection optical unit 7 according to FIG. 1 reduces by a factor of 4.

Other reduction scales are also possible, for example 5×, 6× or 8×, or else reduction scales greater than 8× or less than 4×, e.g. 2× or 1×. For the illumination light 3 having an EUV wavelength, an imaging scale of 4× is suitable, in particular, since this is a conventional scale for microlithography and enables a high throughput in conjunction with a tenable size of a reflection mask 10, which is also designated as a reticle and carries the object to be imaged. Moreover, in the case of an imaging scale of 4×, the required structure size on the reflection mask 10 is large enough to keep manufacturing and qualification outlays for the reflection mask 10 within limits. The image plane 9 is arranged parallel to the object plane 5 in the case of the projection optical unit 7 in the embodiments according to FIG. 2 et seq. An excerpt from the reflection mask 10 which coincides with the object field 4 is imaged in this case. The reticle 10 can be carried by a reticle holder (not illustrated).

Figure 1:
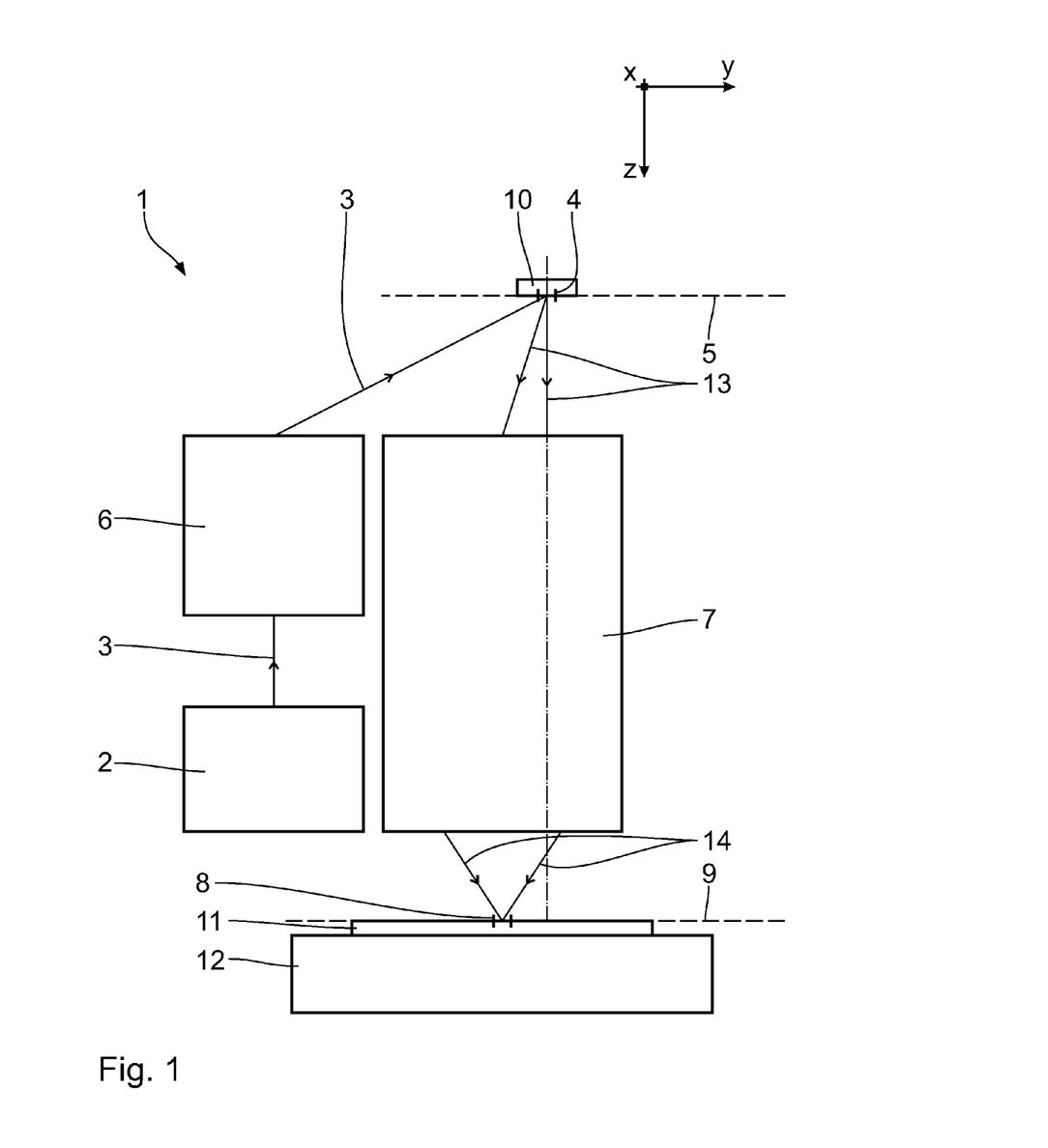
FIG. 1 schematically shows a projection exposure apparatus for EUV microlithography.

The imaging by the projection optical unit 7 is effected onto the surface of a substrate 11 in the form of a wafer carried by a substrate holder 12. FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. The illumination light 3 imaged by the projection optical unit 7 is also designated as imaging light.

In order to facilitate the description of the projection exposure apparatus 1 and the various embodiments of the projection optical unit 7, a global Cartesian xyz coordinate system is indicated in the drawing, which system reveals the respective positional relationship of the components illustrated in the figures. In FIG. 1, the x-direction runs perpendicular to the plane of the drawing into the latter. The y-direction runs toward the right, and the z-direction runs downward.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible.

Different variants of a mirror assembly that is part of the illumination optical unit 6 are explained below with reference to FIG. 2 et seq. In order to facilitate the description of these components, a local Cartesian xyz coordinate system is indicated below, which reveals the respective positional relationship of the components illustrated in the figures. The x-, y- and z-axes of these local coordinate systems coincide.

Figure 2:
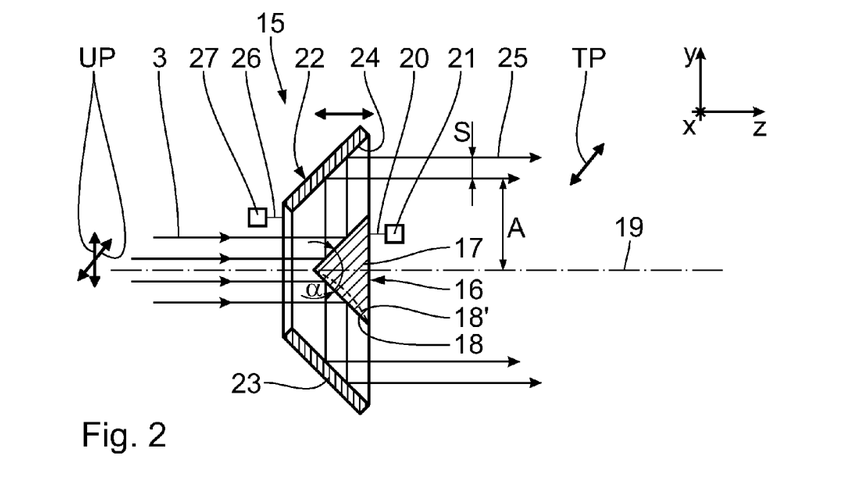
FIG. 2 schematically shows a mirror assembly of an illumination optical unit for projection lithography comprising a first polarization mirror device and a second mirror device, illustrated in an axial section.

FIG. 2 shows a mirror assembly 15 comprising a first polarization mirror device 16 for reflection and polarization of the illumination light 3 incident along the z-direction. The incident illumination light 3 is unpolarized, as is indicated schematically by polarization arrows UP in FIG. 2.

The polarization mirror device 16 has a conical mirror basic body 17 and a reflective cone lateral surface 18. The mirror basic body 17 is embodied in solid fashion. A rotational symmetry axis 19 of the mirror basic body 17 runs through the cone vertex thereof along the z-axis.

The polarization mirror device 16, as indicated schematically at 20 in FIG. 2, is mechanically connected to a drive device 21, that is to say is operatively connected to the drive device 21. Via the drive device 21, the polarization mirror device 16 can be displaced along the z-axis, that is to say along the rotational symmetry axis 19.

In the beam path of the illumination light 3, a second mirror device 22 of the mirror assembly is disposed downstream of the first polarization mirror device 16. The second mirror device 22 reflects the illumination light 3 reflected by the first polarization mirror device 16 and polarized tangentially with respect to the rotational symmetry axis 19. The second mirror device 22 has a ring-shaped outer mirror basic body 23 with a conically extending inner ring mirror surface 24.

The first polarization mirror device 16 has a cone angle (α) of 90°, that is to say reflects the illumination light 3 radially with respect to the z-axis. After reflection at the inner ring mirror surface 24 of the second mirror device 22, the illumination light 3 runs in the form of a ring beam parallel to the rotational symmetry axis 19 at a distance A. The ring beam 25 has a ring thickness S.

In the ring beam 25, the illumination light 3 is present in a manner polarized tangentially with respect to the rotational symmetry axis 19, as is indicated schematically by an arrow TP in FIG. 2.

As indicated schematically at 26 in FIG. 2, the second mirror device 22 is operatively connected to a further drive device 27. With the aid of the second drive device 27, the second mirror device 22 can be displaced parallel to the rotational symmetry axis 19.

With the aid of the drive devices 21 and 27, respectively, the two mirror devices 16, 22 can be displaced between at least two relative positions, which correspondingly leads at least to two beam geometries of the illumination light 3 after reflection at the second mirror device 22. If, by way of example, the polarization mirror device 16 is displaced in the negative z-direction, proceeding from the relative position according to FIG. 2, with the aid of the first drive device 21, the distance between the ring beam 25 and the rotational symmetry axis 19 decreases, whereas the thickness S of the ring beam 25 remains constant.

The rotational symmetry axis 19 of the mirror assembly 15 is also designated as the optical axis. A pupil facet mirror can be disposed downstream of the mirror assembly 15 in the illumination optical unit 6, as is known, for example, from WO 2006/111 319 A2. With the mirror assembly 15, different annular illuminations which differ in terms of the radius can be applied to the pupil facet mirror. This correspondingly results in corresponding annular illumination settings having, depending on the relative position of the two mirror devices 16, 22 with respect to one another, different minimum and maximum limiting angles of an illumination angle of an illumination of the reflection mask 10.

Further embodiments of mirror assemblies and polarization mirror devices as parts of embodiments of illumination optical units for projection lithography are explained below with reference to FIGS. 3 and 4. Components corresponding to those which have already been described above with reference to FIGS. 1 and 2 bear the same reference numerals and will not be discussed in detail again.

Figure 3:
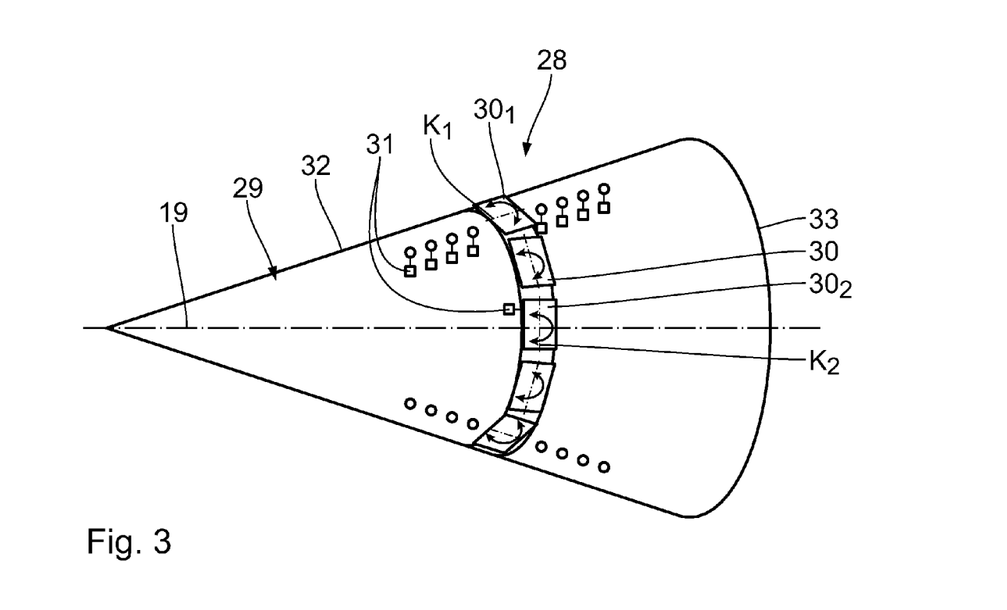
FIG. 3 shows a further embodiment of a first polarization mirror device for a mirror assembly according to FIG. 2 comprising a plurality of mirror facets mounted on a cone supporting frame.

FIG. 3 shows a further embodiment of a polarization mirror device 28, which can be used instead of the polarization mirror device 16 in the mirror assembly 15 according to FIG. 2. Alternatively, the polarization mirror device 28 can be used without a downstream mirror device in the manner of the second mirror device 22 according to FIG. 2 in an embodiment (not illustrated) of an illumination optical unit. The polarization mirror device 28 has an inner mirror basic body 29 in the form of a cone supporting frame having a conical basic shape, which is embodied as rotationally symmetrical about the rotational symmetry axis 19. A plurality of mirror facets 30, of which five mirror facets 30 are illustrated in FIG. 3, are mounted on the cone supporting frame 29. The mirror facets 30 are tiltable about at least one tilting axis via respectively assigned facet actuators 31.

The mirror facets 30 illustrated are arranged along a ring around the symmetry axis 19 on the cone supporting frame 29. As illustrated schematically by points in FIG. 3, further mirror facets 30 lie close together on further rings respectively adjacent to one another around the symmetry axis 19 on the cone supporting frame 29. The mirror facets 30 not illustrated are also tiltable about at least one tilting axis via assigned facet actuators 31, as indicated schematically in FIG. 3. A tilting axis $K_1$ of the mirror actuators 30 respectively lies in a plane containing the rotational symmetry axis 19 of the cone supporting frame 29 and runs parallel to a cone lateral surface 32 of the basic shape of the cone supporting frame 29. Such a tilting axis is illustrated in a dashed manner at $K_1$ for the mirror facet $30_1$ in FIG. 3. Alternatively or additionally, the mirror facets 30 can be tiltable about a further tilting axis $K_2$, which runs tangentially with respect to the rotational symmetry axis 19 of the cone supporting frame 29 and parallel to a cone base surface 33 of the cone supporting frame 29. Such a tilting axis $K_2$ is illustrated for the mirror facet $30_2$ in FIG. 3.

A different course of the tilting axes $K_1$, $K_2$, which runs at a small angle with respect to the courses of the tilting axes $K_1$, $K_2$ as depicted and described above, is also possible.

Instead of a cone lateral surface 18 running rectilinearly in the meridional section illustrated, the cone lateral surface can also have a curved course, as indicated in a dashed manner at 18' in FIG. 2.

Figure 4:
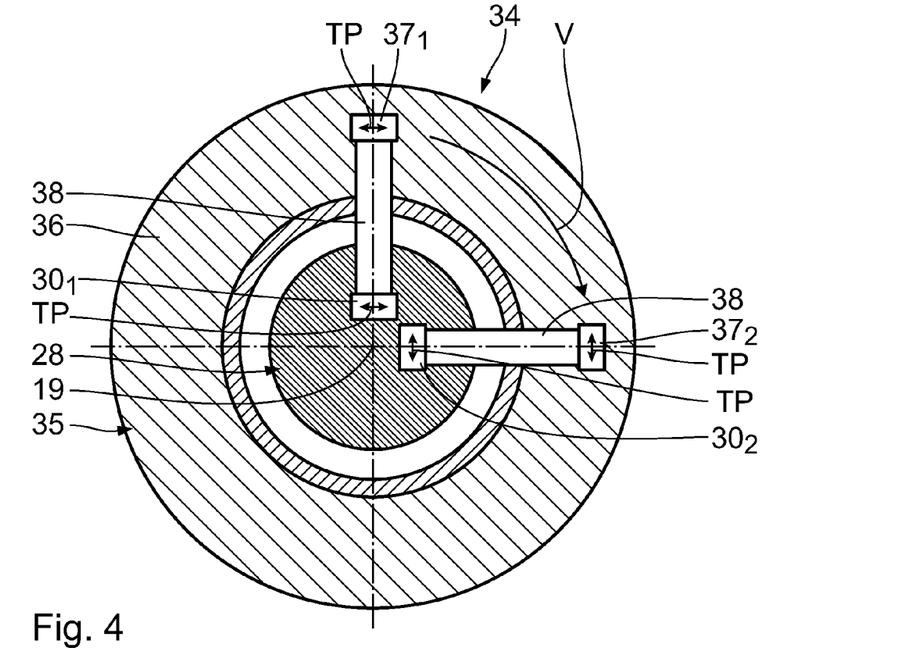
FIG. 4 schematically shows a view along a rotational symmetry axis of a mirror assembly comprising a first polarization mirror device according to FIG. 3 and a second mirror device comprising a ring-shaped outer mirror basic body and a plurality of mirror facets mounted thereon, wherein only two mirror facets of the first polarization mirror device and of the second mirror device, the mirror facets being assigned to one another respectively via the reflection of an illumination light partial beam, are illustrated.
Figure 5:
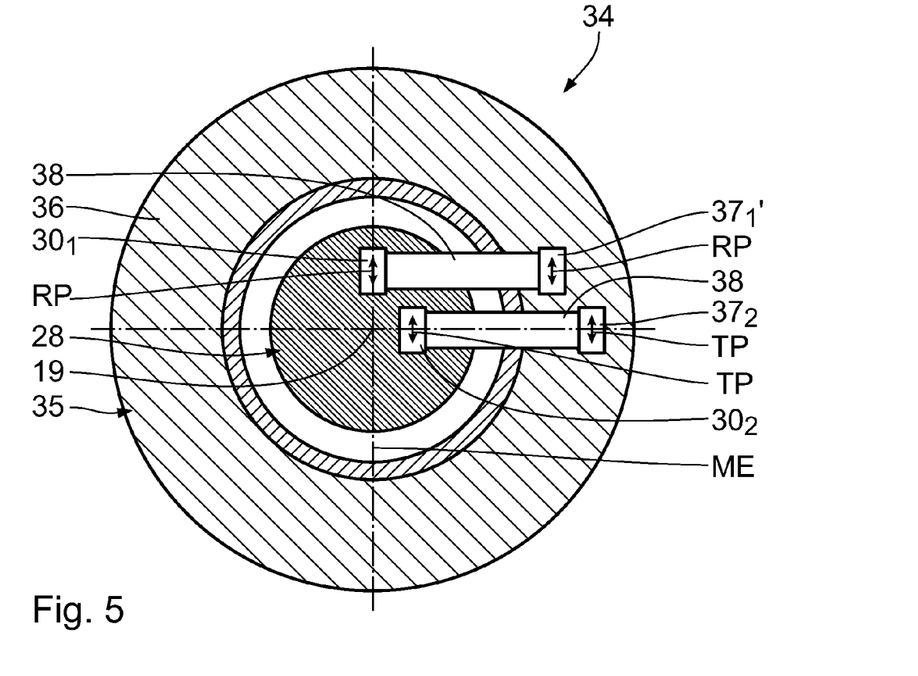
FIG. 5 shows, in a view similar to FIG. 4, the mirror assembly, in which a mirror facet of the polarization mirror device has been tilted into a different tilting position in comparison with FIG. 4, such that this mirror facet is now assigned, via an illumination channel, another of the mirror facets of the second mirror device for guiding an illumination light partial beam.

With reference to FIGS. 4 and 5, a description will be given of different polarization settings of the mirror facets 30 of the polarization mirror device 28 in a mirror assembly 34, which, besides the polarization mirror device 28, also has a second mirror device 35, which can be used instead of the second mirror device 22 of the embodiment according to FIG. 2. The second mirror device 35 has a ring-shaped outer mirror basic body 36 in the form of a ring supporting frame and a plurality of mirror facets 37 mounted on the ring supporting frame 36, two of the mirror facets 37, namely the mirror facets $37_1$ and $37_2$, being illustrated in FIG. 4. FIG. 4 also illustrates two of the mirror facets 30 of the polarization mirror device 28, namely the mirror facets $30_1$ and $30_2$ assigned to the mirror facets $37_1$, $37_2$ of the second mirror device 35 respectively via an illumination channel for an illumination light partial beam 38.

FIG. 4 illustrates the mirror assembly 34 in a schematic view along the rotational symmetry axis 19. The illumination light 3 impinges on the polarization mirror device 28 from the observer perpendicularly to the plane of the drawing in FIG. 4. The two partial beams 38 are reflected by the mirror facets $30_1$, $30_2$ of the polarization mirror device 28 in each case in a radial direction with respect to the symmetry axis 19, thus resulting in a tangential polarization with respect to the symmetry axis 19, as indicated by polarization arrows TP in FIG. 4. After reflection at the mirror facets $37_1$, $37_2$ of the two mirror devices 35, this tangential polarization is retained analogously to the explanation above concerning the mirror assembly 15 according to FIG. 2.

Instead of a continuous ring beam 25, the discrete facet arrangement of the mirror assembly 34 according to FIG. 4 generates a ring beam constructed from discrete partial beams.

FIG. 5 shows a further tilting configuration of the mirror facets 30, 37 of the mirror assembly 34. The mirror facet $30_1$ of the polarization mirror device 28 has then been tilted such that it deflects the partial beam 38 in a tangential direction perpendicular to a meridional plane ME comprising both the symmetry axis 19 and the midpoint of the reflection surface of the mirror facet $30_1$. The partial beam 38 is now reflected from the mirror facet $30_1$ to a mirror facet $37_1$', which, as indicated by an offset arrow V in FIG. 4, is arranged at a position offset approximately by 90° in the clockwise direction on the ring supporting frame 36. On account of the deflection—perpendicular to the plane ME—of the partial beam 38 by the mirror facet $30_1$, the partial beam 38 in the tilting configuration according to FIG. 5 is now polarized radially with respect to the rotational symmetry axis 19, as indicated by polarization arrows RP in FIG. 5.

As a result of this azimuthal redistribution of the partial beam 38 in the tilting configuration of the mirror facets 30, 37 according to FIG. 5 in comparison with the tilting configuration according to FIG. 4, instead of a ring beam it is also possible, for example, to generate an illumination light beam for generating a multipole illumination. A distance between the respective poles and the symmetry axis 19 or the optical axis can then be brought about independently of a tilting of the mirror facets 30, 37 via the displacement drive 27.

By predefining the respective tilting configuration of the mirror facets 30 of the polarization mirror device 28 of the mirror assembly 34, therefore, it is possible to influence not only the geometry of the polarization distribution of all the partial beams 38 that is reflected by the mirror assembly 34, but also the polarization distribution. It is clear that polarization mixed forms between tangential and radial polarization are possible depending on the deflection angle of the mirror facets 30 of the polarization mirror device 28. These mixed forms can be predefined by way of the tilting angles about the tilting axes $K_1$, $K_2$ according to FIG. 3.

Figure 6:
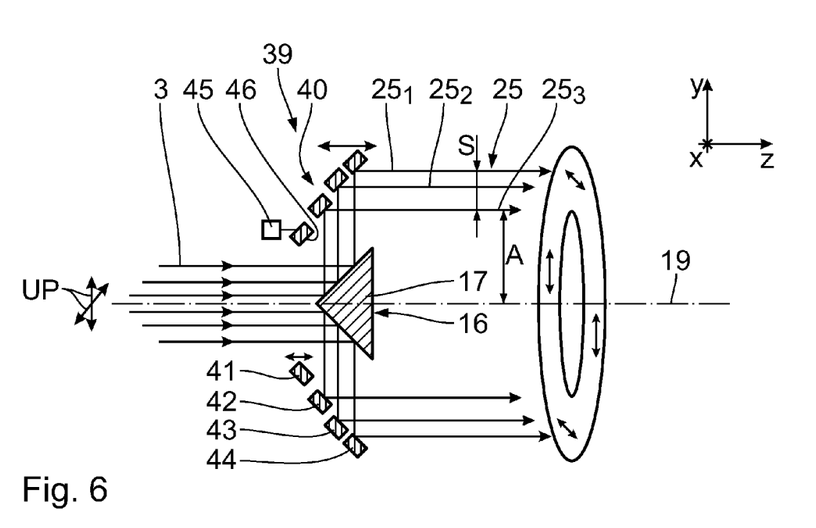
FIG. 6 shows, in an illustration similar to FIG. 2, a further embodiment of a mirror assembly of an illumination optical unit for projection lithography, in which the second mirror device has a plurality of ring supporting frames displaceable relative to one another.

FIG. 6 shows a further variant of a mirror assembly 39, which can be used instead of the mirror assemblies 15 or 34 in the illumination optical unit 6.

In contrast to the mirror assembly according to FIG. 2, the mirror assembly 39 has a second mirror device 40 comprising a plurality of ring supporting frames 41, 42, 43, 44, which are numbered consecutively from the inner area outward with increasing radius with respect to the rotational symmetry axis 19 in FIG. 6. As illustrated by way of example on the innermost ring supporting frame 41 in FIG. 6, the ring supporting frames 41 to 44 are displaceable axially relative to one another with the aid of a drive device 45, which is operatively connected to them, along a ring rotational symmetry axis, which coincides with the rotational symmetry axis 19 of the polarization mirror device 16.

The ring supporting frames 41 to 44 can have inner ring mirror surfaces 46 extending circumferentially continuously in a ring-shaped fashion in the manner of the ring mirror surface 24 of the second mirror device 22 according to FIG. 2, such that the ring beam generated by the mirror assembly 39 results as a superposition of different individual rings, of which three individual rings $25_1$, $25_2$ and $25_3$ are illustrated in FIG. 6. The individual rings $25_1$ to $25_3$ then respectively form an individual distance A with respect to the rotational symmetry axis 19 and an individual ring thickness S. Alternatively, it is possible to embody the second mirror device 40 with discrete mirror facets in the manner of the mirror facets 37, which are mounted on the inside on the ring supporting frames 41 to 44.

Figure 7:
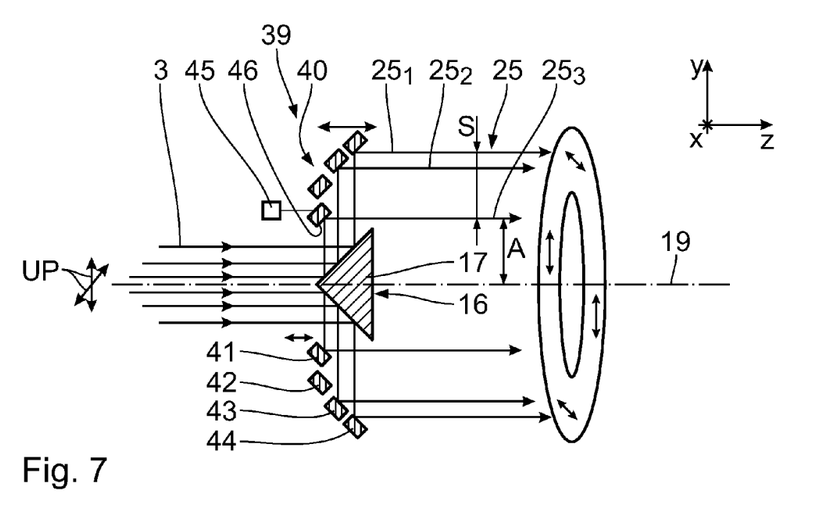
FIG. 7 shows the mirror assembly according to FIG. 6 in a different relative position of the ring supporting frames of the second mirror device.

FIG. 7 shows the mirror assembly 39 with a different relative position of the ring supporting frames 41 to 44 with respect to one another. In comparison with the ring supporting frame configuration according to FIG. 6, in the configuration according to FIG. 7, the innermost ring supporting frame 41 is displaced in the positive z-direction by the drive device 45 to an extent such that the innermost ring supporting frame 41 now has a reflective effect for the illumination light instead of the second-innermost ring supporting frame 42. The partial ring $25_3$ of the ring beam 25 correspondingly has a smaller distance from the optical axis 19 in the configuration according to FIG. 7 in comparison with the configuration according to FIG. 6. A thickness S of the ring beam 25 is correspondingly increased in the configuration according to FIG. 7 in comparison with the configuration according to FIG. 6.

Figure 8:
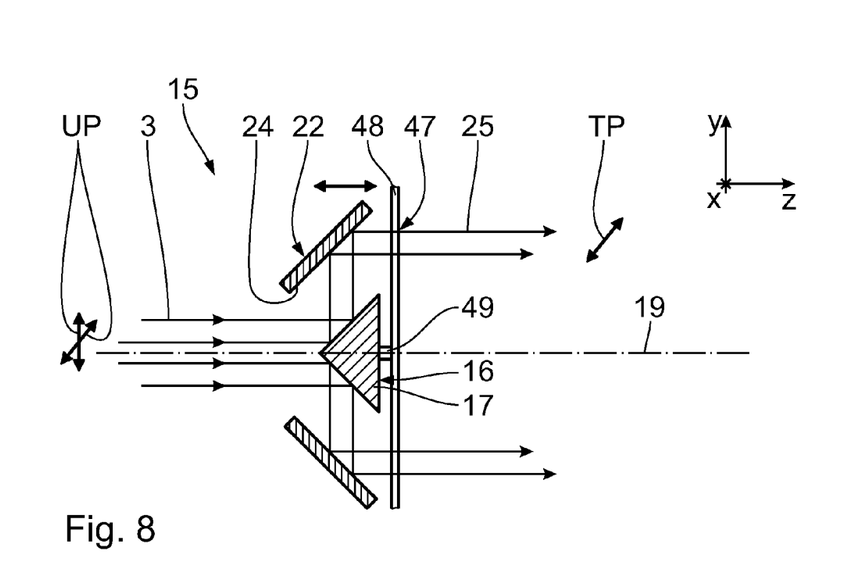
FIG. 8 shows the mirror assembly according to FIG. 2 comprising an active cooling device.

FIG. 8 shows the mirror assembly 15 comprising an active cooling device 47. The latter comprises a coolant line 48 in the form of two spoke lines having a radial course component with respect to the rotational symmetry axis 19. The coolant line 48 leads into a coolant supply line 49, which supplies the interior of the mirror basic body 17 of the polarization mirror device 16 with coolant, for example with water, some other cooling liquid or a cooling gas. The coolant can be fed via one of the spoke lines of the coolant line 48 illustrated in FIG. 8 and the coolant can be discharged via the other of the spoke lines, to and from the inner mirror basic body 17.

Figure 9:
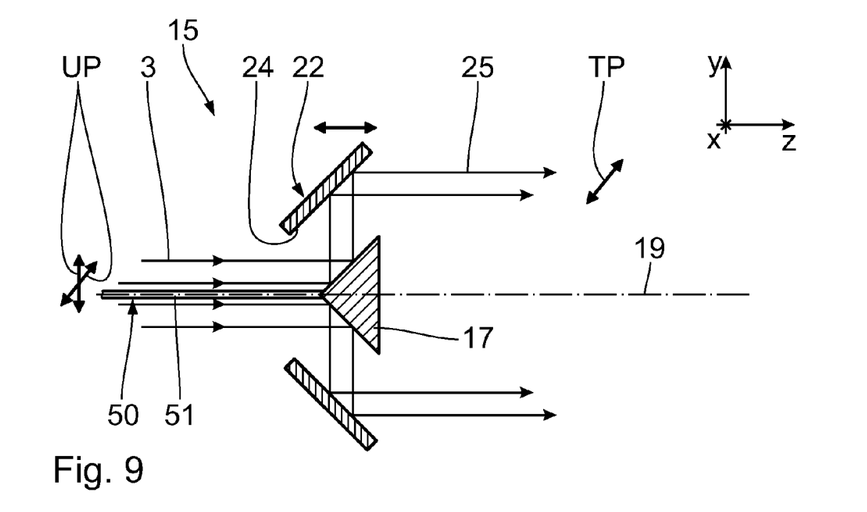
FIG. 9 shows the mirror assembly according to FIG. 2 comprising a further embodiment of an active cooling device.

FIG. 9 shows a further embodiment of an active cooling device 50, which can be used instead of the cooling device 47 according to FIG. 8 and has an axial line 51, which runs along the rotational symmetry axis 19 of the inner mirror basic body 17 and supplies the interior of the mirror basic body 17 with coolant.

In order to produce a micro- or nanostructured component, the projection exposure apparatus 1 is used as follows: firstly, the reflection mask 10 or the reticle and the substrate or the wafer 11 are provided. Afterward, a structure on the reticle 10 is projected onto a light-sensitive layer of the wafer 11 with the aid of the projection exposure apparatus. By developing the light-sensitive layer, a micro- or nanostructure is then produced on the wafer 11 and the microstructured component is thus produced.

The invention claimed is:

1. An illumination optical unit, comprising:
   a first mirror device configured to reflect and polarize light;
   a second mirror device configured to reflect the light, the second mirror device being downstream of the first polarization mirror device along a path of the light through the illumination optical unit, the second mirror device comprising:
      a ring-shaped outer mirror basic body in the form of a ring-shaped supporting frame; and
      a plurality of mirror facets supported by the ring-shaped supporting frame; and
   a drive device configured to cause relative displacement of the first and second mirror devices between first and second relative positions,
   wherein:
      in the first relative position, a beam of the light has a first geometry after reflecting from the second mirror device;
      in the second relative position, the beam of the light has a second geometry after reflecting from the second mirror device;
      the second geometry is different from the first beam geometry; and
      the illumination optical unit is a projection lithography illumination optical unit.

2. The illumination optical unit of claim 1, wherein the first mirror device comprises a conical mirror basic body.

3. The illumination optical unit of claim 2, further comprising an active cooling device for the conical mirror basic body of the first mirror device.

4. The illumination optical unit of claim 3, further comprising a coolant line comprising a spoke line which has a radial course component with respect to a rotational symmetry axis of the conical mirror basic body of the first mirror device.

5. The illumination optical unit of claim 4, further comprising a coolant feed line via an axial line which runs along a rotational symmetry axis of the conical mirror basic body of the first mirror device.

6. The illumination optical unit of claim 3, further comprising a coolant feed line via an axial line which runs along a rotational symmetry axis of the conical mirror basic body of the first mirror device.

7. The illumination optical unit of claim 2, wherein the conical mirror basic body of the first mirror device in the form of a cone supporting frame having a conical basic shape, and the first mirror device comprises a plurality of mirror facets supported by the cone supporting frame.

8. The illumination optical unit of claim 7, wherein at least some of the mirror facets of the first mirror device are tiltable about at least one tilting axis via assigned facet actuators.

9. The illumination optical unit of claim 8, wherein the tilting axis lies in a plane containing the rotational symmetry axis of the cone supporting frame and runs parallel to a cone lateral surface of the basic shape of the cone supporting frame.

10. The illumination optical unit of claim 9, wherein the tilting axis runs tangentially with respect to the rotational symmetry axis of the cone supporting frame and parallel to a cone base surface of the basic shape of the cone supporting frame.

11. The illumination optical unit of claim 8, wherein the tilting axis runs tangentially with respect to the rotational symmetry axis of the cone supporting frame and parallel to a cone base surface of the basic shape of the cone supporting frame.

12. The illumination optical unit of claim 1, wherein the outer mirror basic body comprises at least two ring supporting frames which are displaceable relative to one another along a ring rotational symmetry axis axially with the drive device.

13. An optical system, comprising:
an illumination optical unit according to claim 1, the illumination field being configured to illuminate an object field; and
a projection optical unit configured to image the object field into an image field.

14. An apparatus, comprising:
an illumination system, comprising:
an EUV light source; and
an optical system an illumination optical unit according to claim 1, the illumination field being configured to illuminate an object field; and
a projection optical unit configured to image the object field into an image field.

15. The apparatus of claim 14, further comprising:
a first object holder configured to mount a first object arrangeable in the object field; and
a second object holder configured to mount a second object arrangeable in the image field.

16. An illumination optical unit, comprising:
a mirror device configured to reflect and polarize light, the polarization mirror device comprising:
a supporting frame having a conical basic shape; and
a plurality of mirror facets supported by the supporting frame,
wherein at least some of the mirror facets of the mirror device are tiltable about at least one tilting axis via assigned facet actuators, and the illumination optical tool is a projection lithography illumination optical tool.

17. The illumination optical unit of claim 16, wherein the mirror device comprises a conical mirror basic body.

18. An optical system, comprising:
an illumination optical unit according to claim 16, the illumination field being configured to illuminate an object field; and
a projection optical unit configured to image the object field into an image field.

19. An apparatus, comprising:
an illumination system, comprising:
an EUV light source; and
an optical system comprising an illumination optical unit according to claim 16, the illumination field being configured to illuminate an object field; and
a projection optical unit configured to image the object field into an image field.

20. The apparatus of claim 19, further comprising:
a first object holder configured to mount a first object arrangeable in the object field; and
a second object holder configured to mount a second object arrangeable in the image field.

21. An illumination optical unit, comprising:
a mirror device configured to reflect and polarize light, wherein:
the mirror device comprising a ring-shaped outer mirror basic body in the form of a ring-shaped supporting frame; and the outer mirror basic body comprises at least two ring supporting frames which are displaceable relative to one another axially along a ring rotational symmetry axis.

22. The illumination optical unit of claim 21, further comprising a drive device configured to displace the at least two ring supporting frames relative to one another axially along the ring rotational symmetry axis.

* * * * *

UNITED STATES PATENT AND TRADEMARK OFFICE
CERTIFICATE OF CORRECTION

| | |
|---|---|
| PATENT NO. | : 9,507,269 B2 |
| APPLICATION NO. | : 14/135540 |
| DATED | : November 29, 2016 |
| INVENTOR(S) | : Hennerkes et al. |

Page 1 of 1

It is certified that error appears in the above-identified patent and that said Letters Patent is hereby corrected as shown below:

Column 5, Lines 17-18, delete "illustrated," and insert -- illustrated; --.

Signed and Sealed this
Eighteenth Day of April, 2017

Michelle K. Lee
*Director of the United States Patent and Trademark Office*